United States Patent [19]
Agrawal et al.

[11] Patent Number: 5,392,429
[45] Date of Patent: Feb. 21, 1995

[54] METHOD OF OPERATING A MULTIPROCESSOR COMPUTER TO SOLVE A SET OF SIMULTANEOUS EQUATIONS

[75] Inventors: Prathima Agrawal, New Providence, N.J.; Ricardo Telichevesky, Cambridge, Mass.; John A. Trotter, Somerville, N.J.

[73] Assignee: AT&T Corp., Murray Hill, N.J.

[21] Appl. No.: 98,660

[22] Filed: Jul. 28, 1993

Related U.S. Application Data

[62] Division of Ser. No. 775,170, Oct. 11, 1991, abandoned.

[51] Int. Cl.[6] .......................... G06F 9/44; G06F 9/40
[52] U.S. Cl. .......................... 395/650; 364/DIG. 1; 364/230.3; 364/232.3; 364/281.5; 364/281.7; 364/281.8
[58] Field of Search .......................... 395/650, 500

[56] References Cited

U.S. PATENT DOCUMENTS

| | | | |
|---|---|---|---|
| 3,648,253 | 3/1972 | Mullery et al. | 395/650 |
| 4,318,173 | 3/1982 | Freedman et al. | 395/650 |
| 4,642,756 | 2/1987 | Sherrod | 395/650 |
| 5,012,409 | 4/1991 | Fletcher et al. | 395/650 |
| 5,210,872 | 5/1993 | Ferguson et al. | 395/650 |

OTHER PUBLICATIONS

Telichevesky, P. Agrawal, J. Trotter "Partitioning Schemes for Circuit Simulation on a Multiprocessor Array" IEEE 1991, pp. 177–183.

Telichevesky, P. Agrawal, J. Trotter "A New o(n log n) Scheduling Heuristic for Parallel Decomposition of Sparse Matrices" IEEE 1991 pp. 612–616.

Trotter, P. Agrawal "Circuit Simulation Algorithms on a Distributed Memory Multiprocessor System" IEEE 1990 pp. 438–441.

Sadayappan, V. Visvanathan "Circuit Simulation on Shared-Memory Multiprocessors" IEEE 1988 pp. 1634–1642.

Tarjan, A. Yao "Storing a Sparse Table" Communications of the ACM vol. 22 Nov. 1979 pp. 606–611.

A. Gerasoulis, S. Venugopal, T. Yang "Clustering Task Graphs for Message Passing Architectures" Dept. Computer Science, Rutgers University pp. 1–10.

Sadayappan, V. Visvanathan "Efficient Sparse Matrix Factorization for Circuit Simulation on Vector Supercomputers" IEEE 1989 pp. 1277–1285.

O. Wing, J. Huang "A Computation Model of Parallel Solution Linear Equations" IEEE 1980 pp. 632–667.

T. Nakata, N. Tanabe, H. Onozuka, T. Kurobe, N. Koiket "A Multiprocessor for Modular Circuit Simulation" C&C Systems Research Laboratories, NEC Corp. IEEE 1987 pp. 364–367.

J. Huang, O. Wing "Optimal Parallel Triangulation of a Sparse Matrix" IEEE 1979 pp. 726–732.

*Primary Examiner*—Eddie P. Chan
*Attorney, Agent, or Firm*—Jason P. DeMont; William Ryan

[57] ABSTRACT

The present invention relates to the solution of sets of linear equations by microprocessors. In particular, when the process for solving a set of linear equations can be resolved into a set of tasks, each of which can be processed by a processing element in a multiprocessor computer, embodiments of the present invention determine the scheduling of the processing of respective tasks by each processing element. In an exemplary embodiment, the order in which each processing element should process those tasks distributed to it is determined by computing a cost metric indicative of the amount of time required to process the task and a completion time metric, indicative of the amount of time required to process all remaining tasks after that task is completed. Consequently, the tasks distributed to a given processing element are processed in an order based on the completion time metrics computed for the respective tasks.

2 Claims, 13 Drawing Sheets

EQ.1)  $\dfrac{V_4-V_1}{4} = \dfrac{V_1-V_2}{10}$    => $0.35V_1 - 0.1V_2 + 0.00V_3 - 0.25V_4 + 0I_{in} = 0$ EQ.2)  $\dfrac{V_1-V_2}{10} = \dfrac{V_2}{4} + \dfrac{V_2-V_3}{2}$    => $-0.10V_1 + 0.85V_2 - 0.50V_3 + 0V_4 + 0I_{in} = 0$ EQ.3)  $\dfrac{V_2-V_3}{2} = \dfrac{V_3}{20}$    => $0V_1 - 0.50V_2 + 0.55V_3 + 0V_4 + 0I_{in} = 0$ EQ.4)  $V_4 = 10$    => $0V_1 + 0V_2 + 0V_3 + 1.00V_4 + 0I_{in} = 10$ EQ.5)  $\dfrac{V_4-V_1}{4} = I_{in}$    => $-0.25V_1 + 0V_2 + 0V_3 + 0.25V_4 - 1.00I_{in} = 0$

FIG. 3
(PRIOR ART)

$$\begin{vmatrix} 0.35 & -0.10 & 0 & -0.25 & 0 \\ -0.10 & 0.85 & -0.50 & 0 & 0 \\ 0 & -0.50 & 0.55 & 0 & 0 \\ 0 & 0 & 0 & 1.00 & 0 \\ -0.25 & 0 & 0 & 0.25 & -1.00 \end{vmatrix} \begin{vmatrix} V_1 \\ V_2 \\ V_3 \\ V_4 \\ I_0 \end{vmatrix} \begin{vmatrix} 0 \\ 0 \\ 0 \\ 10 \\ 0 \end{vmatrix}$$

FIG. 4
(PRIOR ART)

| 0.35 | -0.10 | 0 | -0.25 | 0 | 0 |
| --- | --- | --- | --- | --- | --- |
| -0.10 | 0.85 | -0.50 | 0 | 0 | 0 |
| 0 | -0.50 | 0.55 | 0 | 0 | 0 |
| 0 | 0 | 0 | 1.00 | 0 | 10 |
| -0.25 | 0 | 0 | 0.25 | -1.00 | 0 |

FIG. 5
(PRIOR ART)

| X | X |   | X |   | ¦ X |
| --- | --- | --- | --- | --- | --- |
| X | X | X | F |   | ¦ X |
|   | X | X | F |   | ¦ X |
|   |   |   | X |   | ¦ X |
| X | F | F | X | X | ¦ X |

FIG. 16

| | | | | | |
|---|---|---|---|---|---|
| 0.35 | -0.286 | 0 | -0.714 | 0 | 0 |
| -0.10 | 0.85 | -0.50 | 0 | 0 | 0 |
| 0 | -0.50 | 0.55 | 0 | 0 | 0 |
| 0 | 0 | 0 | 1.00 | 0 | 10 |
| -0.25 | 0 | 0 | -0.25 | 1.00 | 0 |

FIG. 17

| | | | | | |
|---|---|---|---|---|---|
| 0.35 | -0.286 | 0 | -0.714 | 0 | 0 |
| -0.10 | 0.821 | -0.50 | -0.571 | 0 | 0 |
| 0 | -0.50 | 0.55 | 0 | 0 | 0 |
| 0 | 0 | 0 | 1.00 | 0 | 10 |
| 0.25 | 0.0715 | 0 | -0.0715 | 1.00 | 0 |

FIG. 18

| | | | | | |
|---|---|---|---|---|---|
| 0.35 | -0.286 | 0 | -0.714 | 0 | 7.70 |
| -0.10 | 0.821 | -0.609 | -0.0870 | 0 | 1.95 |
| 0 | -0.50 | 0.246 | 0.177 | 0 | 1.77 |
| 0 | 0 | 0 | 1.00 | 0 | 10 |
| 0.25 | 0.0714 | 0.0438 | -0.0575 | 1.00 | 0.575 |

METHOD OF OPERATING A MULTIPROCESSOR COMPUTER TO SOLVE A SET OF SIMULTANEOUS EQUATIONS

This is a division of application Ser. No. 07/775,170, filed Oct. 11, 1991, now abandoned.

BACKGROUND OF THE INVENTION

1. Field of the Invention

The invention relates to computer systems in general and, more particularly, to computer methods and systems for solving sets of equations that can be represented in matrix form.

2. Description of the Related Art

Solving sets of equations is useful in, inter alia, mechanics, economics, fluid dynamics and electric circuit simulation. Circuit simulation, for example, typically involves assembling a set of equations that model the behavior of an electric circuit and then solving such set of equations to learn the value of unknown voltages and currents in the circuit. The equations that describe the circuit being simulated are often nonlinear and, for this reason, an iterative technique, such as the Newton Raphson method has typically been used to solve such set of equations. Various iterative techniques, including the Newton Raphson method, are well known to persons having ordinary skill in the art.

One part of the Newton Raphson method involves solving a set of linear equations. Empirically, the time needed to solve the set of equations dominates the time needed to simulate a large circuit. Using conventional circuit simulation techniques, even the most powerful supercomputers take many hours to complete a simulation and therefore, the simulation of large integrated circuits is still impractical.

Although a number of methods can be used to solve a set of linear equations, Lower Upper Decomposition ("LUD"), a method well known to persons having ordinary skill in the art, is generally preferred because of its accuracy and stability. LUD, however, cannot be parallelized easily.

A number of efforts have been made to parallelize LUD. J. Huang and O. Wing, "Optimal Parallel Triangulation of a Sparse Matrix," *I.E.E.E. Trans. on Circuits and Systems,* Vol. CAS-26, pp. 726–732 (Sept. 1979); N. Karmarkar, "A New Parallel Computer for Sparse Matrix Computation," *Siam Conference on Discrete Mathematics,* Atlanta (June 1990); and O. Wing and J. Huang, "A Computation Model of Parallel Solution of Linear Equations," *I.E.E.E. Trans. on Computers,* Vol. C-29, pp. 632–638 (July 1980). These methods concentrate on precompiling each step required in LUD and constructing a task graph which is then scheduled to run on a multiprocessor. These procedures yield a large number of tasks that need to be scheduled and require too much computer memory for realistic circuits.

An alternative approach, proposed by P. Sadayappan and V. Visvanathan, "Circuit Simulation on Shared Memory Multiprocessors," *I.E.E.E. Transactions on Computers,* Vol. C-37, pp. 1634–1642 (Dec. 1988), uses a partially compiled approach which has been shown to be very effective in extracting a high degree of parallelism from LUD of sparse matrices while minimizing the complexity of the task graph that has to be scheduled. This approach is a good compromise between the generic LUD approach and the compiled approach.

The Sadayappan-Visvanathan approach was originally developed for a shared memory multiprocessor and extended for use on a distributed memory multiprocessor in J. Trotter and P. Agrawal, "Circuit Simulation Methods on a Distributed Memory Multiprocessor System," *I.E.E.E. Proceedings ICCAD,* Santa Clara, pp. 438–441 (Nov. 1990). This reference is hereby incorporated by paper into this specification.

Another approach proposed by T. Nakata, N. Tanabe, H. Onozuka, T. Kurobe and N. Koike in "A Multiprocessor System for Modular Circuit Simulation," *I.E.E.E. ICCAD,* pp. 364–367 (1987), used LUD without compilation on a distributed memory multiprocessor. In the Nakata et. al. system each processor can access the memory of other processors using a shared bus.

SUMMARY OF THE INVENTION

Embodiments of the present invention are capable of solving a set of linear equations on a multiprocessor computer more quickly than techniques found in the prior art. In particular, when the process for solving a set of linear equations can be resolved into a set of tasks, each one of which can be processed by a processing element in a multiprocessor computer, embodiments of the present invention determine the scheduling of the processing of the respective tasks by each processing element.

These results are obtained in an illustrative embodiment of the present invention that resolves a set of linear equations into a plurality of tasks and then distributes each of the tasks to one of the processing elements in a multiple instruction stream-multiple data stream computer computer. To determine in what order each processing element should process those tasks distributed to it, a cost metric $cost(v_j)$ is first computed, which is indicative of the amount of time that said processing element receiving the task will require to process the task. Next, a remaining completion time metric $\delta_i$ is computed, which is indicative of the amount of time needed by said computer to process all of the remaining tasks after that task has been completed and which is at least partially based on said cost metric $cost(v_j)$. Finally, for a given processing element, the tasks distributed to that processing element are processed in an order based on the completion time metrics computed for the respective tasks.

BRIEF DESCRIPTION OF THE DRAWING

FIG. 3 shows a matrix representation of the set of equations shown in FIG. 2.

FIG. 4 shows an augmented matrix corresponding to the matrix shown in FIG. 3.

FIG. 5 shows the zero/non-zero structure of the augmented matrix shown in FIG. 4.

FIG. 16 shows the matrix of FIG. 4 after the first task has been completed.

FIG. 17 shows the matrix of FIG. 4 after three tasks have been completed.

FIG. 18 shows the solution matrix corresponding to the circuit of FIG. 1.

DETAILED DESCRIPTION

1. Introduction

The invention provides a computer system and method for modeling or simulation. It is believed that the illustrative embodiment of the invention to be described will be more easily understood by presenting it in the context of solving an illustrative problem. Although the illustrative embodiment can solve problems arising in diverse fields, the illustrative problem is from electrical engineering. In the next section, the illustrative problem will be presented. Next, an illustrative embodiment of the invention will be presented and finally it will be shown how the illustrative problem can be solved with the illustrative embodiment.

2. The Illustrative Problem 2.1. Electric Circuit Design

Figures 1, 2:
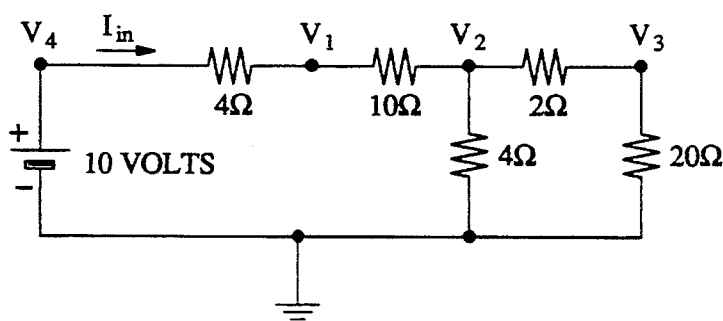
FIG. 1 shows a schematic diagram of a typical electric circuit to be analyzed by an illustrative embodiment of the invention.
FIG. 2 shows a set of equations that model the electrical characteristics of the electric circuit in FIG. 1.

Electric circuits, such as the one represented by the schematic diagram in FIG. 1, are typically designed to perform a specific function. While a great deal is known about designing electric circuits, it remains substantially empirical such that fabricated circuits often do not perform as intended by their designers. When the cost of fabrication and testing is low, a circuit can be iteratively designed, fabricated, tested and re-designed until it performs as desired. But when the cost of fabrication and/or testing is high, it is advantageous to verify that the circuit design will perform as intended before it is fabricated.

One means of predicting the electrical characteristics of a design is through a technique known as "circuit simulation." Circuit simulation involves building a mathematical model of a circuit based upon mathematical models of the circuit elements and on the topology of the circuit. Once the model of the circuit is created, its behavior can be accurately predicted through well-known techniques.

2.2. An Illustrative Electric Circuit

As is well known to persons having ordinary skill in the art, the electric circuit represented by the schematic diagram in FIG. 1 comprises a voltage source and five resistors. For purposes of illustration, suppose that the voltage source is 10 volts and that the designer of the circuit intends that in the fabricated circuit the voltage at $V_2$ is 2.0 volts and the voltage at $V_3$ is 0.175 volts. To assure that the design will perform as desired, it should be simulated.

2.3. Modeling the Illustrative Electric Circuit

As is well known to persons having ordinary skill in the art, the electric circuit represented in FIG. 1 can be modeled, according to Kirchhoff's Current Law and Kirchhoff's Voltage Law, and according to the well known technique known as Modified Nodal Analysis, by the set of five equations shown in FIG. 2.

In general, circuit simulation requires that the equations modeling a circuit be intensively manipulated. To permit them to be more easily manipulated, especially by computer, the equations are typically represented in matrix form. As is well known to persons having ordinary skill in the art, the set of equations in FIG. 2 can be represented in matrix form as shown in FIG. 3.

2.4. Simulating the Circuit

As is well known to persons having ordinary skill in the art, the matrix of FIG. 3 can be solved using a number of well known techniques. J. Vlach and K. Singhal, "Computer Methods for Circuit Analysis and Design," Van Nostrand Reinhold, 1983, and P. C. Shields, *Elementary Linear Algebra*, 3rd Ed., 1980 are hereby incorporated by reference into this specification. In circuit simulation a high degree of accuracy is required and therefore techniques which give exact solutions are preferred. One such technique is Lower Upper Decomposition ("LUD") followed by Forward Elimination ("FE") and Back Substitution ("BS").

As is well known to persons having ordinary skill in the art, LUD involves two operations: normalization and updating. In summary: normalization involves dividing each after-diagonal element of a row by its diagonal element and updating involves manipulating the rows below the diagonal element of the most recently normalized row. The procedure starts with the top left diagonal element and proceeds down the diagonal. The LUD is complete when all of the diagonal elements have been normalized. According to one technique, after LUD is completed, the FE and BS is performed to yield the solution to $V_2$ and $V_3$.

Empirically, some matrices have a high percentage of zero elements and are therefore said to be "sparse." In contrast, matrices with a low percentage of zero elements are said to be "dense." While the LUD of a sparse matrix can be identical to the LUD of a dense matrix, the presence of numerous zero elements in the sparse matrix means that many of the operations carried out in performing the LUD are unnecessary.

In the preferred embodiment, Forward Elimination is carried out concurrently with the LUD in a manner that is well known to persons having ordinary skill in the art. In summary, the matrix representing the coefficients is augmented with the vector representing the fight hand side of the equations in FIG. 3. FIG. 4 presents the augmented matrix corresponding to the matrix of FIG. 3.

FIG. 5 shows a representation of the matrix of FIG. 4 where an "X" represents the position of a non-zero value in the matrix. As is well known to persons having ordinary skill in the art, during LUD additional non-zero elements are introduced into the matrix in determinable positions. These are represented by "F"s in FIG. 5. This is significant because it affects the scheduling of the tasks needed for LUD.

2.5. A Task Graph for Solving the Matrix

In general, LUD, FE and BS require that each row be successively normalized and that each row that has a non-zero element (i.e., an "X" or an "F") under the diagonal of the row normalized be updated. As is well known to persons having ordinary skill in the art, based solely on the position of the Xs and Fs in a matrix, a schedule can be generated of the operations needed to solve the set of equations represented by the matrix. A representation of the operations to be performed and their interdependencies can be drawn. Such a representation is known as a "task graph."

Figure 6:
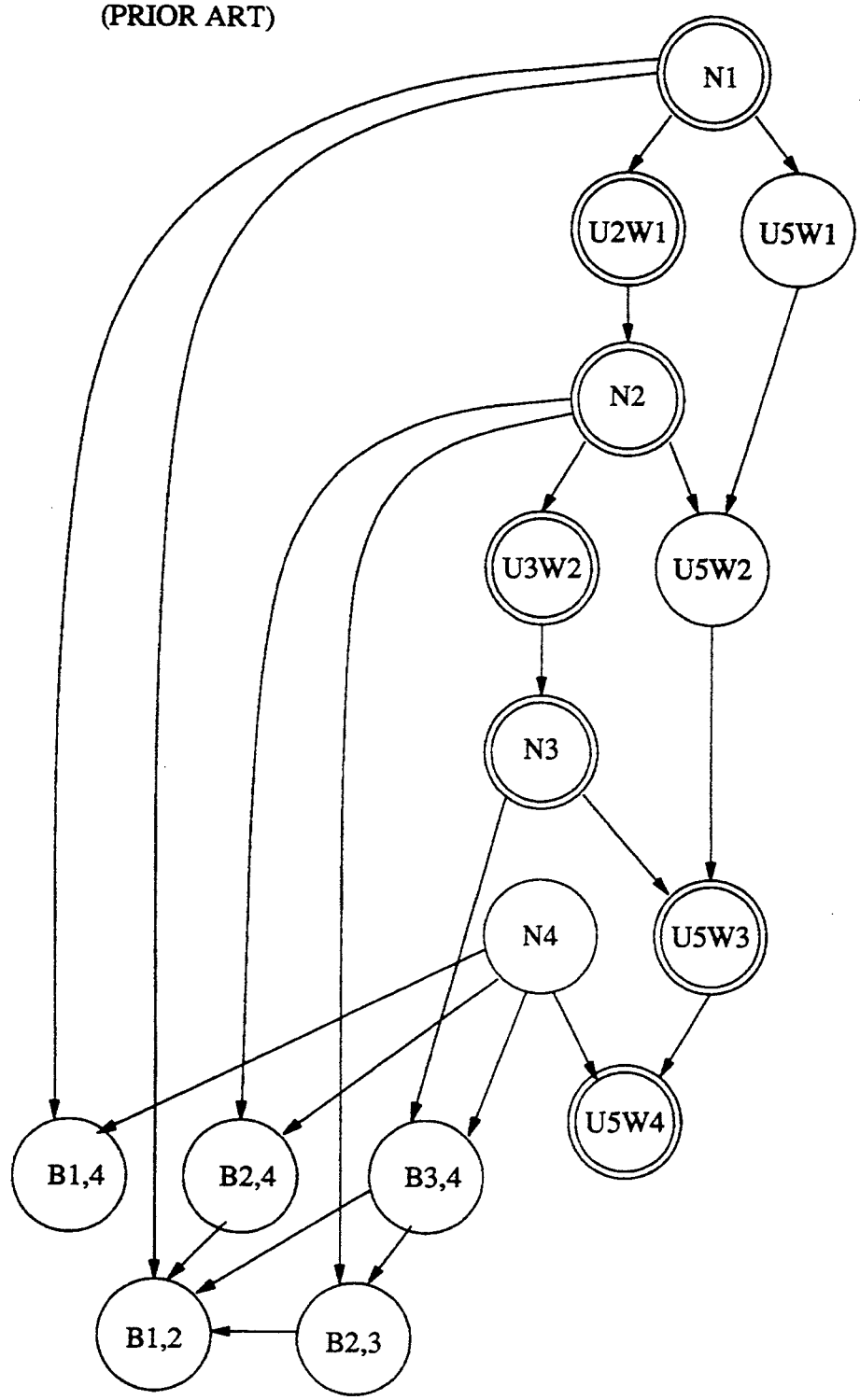
FIG. 6 shows a task graph for solving the augmented matrix in FIG. 5.

The construction of task graphs from matrices is well known to persons having ordinary skill in the art. O. Wing and I. Huang, "A Computation Model of Parallel Solution of Linear Equations," *I.E.E.E. Trans. on Computers*, Vol. C-29, pp. 632–638 (July 1980), and P. Sadayappan and V. Visvanathan, "Circuit Simulation on Shared Memory Multiprocessors," *I.E.E.E. Transactions on Computers*, Vol. C-37, pp. 1634–1642 (Dec. 1988) are hereby incorporated by reference into this specification. A task graph can be derived from the pattern of non-zero and fill-in elements in a matrix. FIG. 6 presents the task graph associated with the matrix shown in FIG. 5. The task graph can be derived by representing each row normalization, row update and back-substitution operation as a task and by noting the interdependencies of the tasks.

A task is represented in the task graph by a circle circumscribing a description of the operation to be performed. A description prefaced with an "N" represents a normalization operation. A description prefaced with a "U" represents an update operation and a description prefaced with a "B" represents a back substitution operation. The number following the prefixes "N" and "U" designate the row to be operated on. For example, the task containing the description "N1" means normalize row 1 and the task containing the description "U2W1" means update row 2 with information from row 1. The pair of numbers following the prefix "B" is the row and column, respectively, of the element in the matrix involved in back substitution. A given task can only be performed when all of the preceding tasks that feed information to it have been performed.

3. An Illustrative Embodiment of the Invention
3.1. In General

When, as in FIG. 6, the task graph indicates that two or more tasks are independent, the task graph can be completed more rapidly by performing those tasks in parallel. An illustrative embodiment of the invention, presented in FIG. 7, permits the tasks to be performed largely in parallel.

3.2. The Organization of the Illustrative Embodiment

Figure 7:
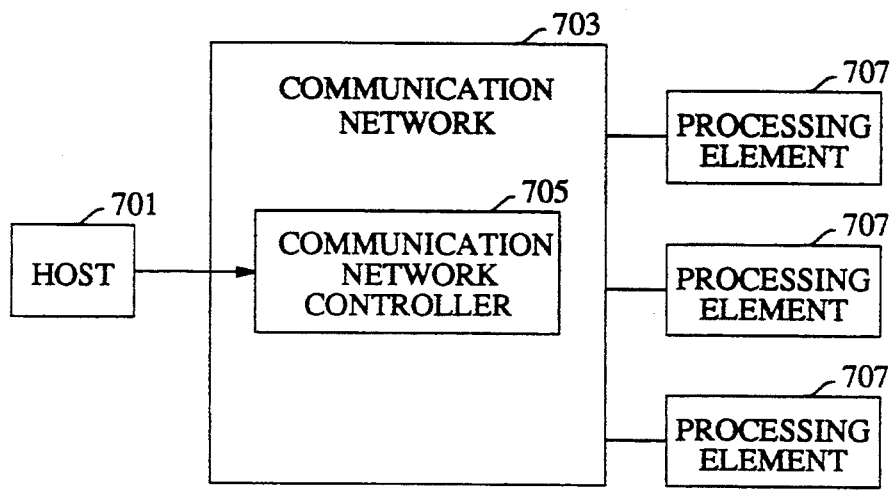
FIG. 7 shows an overview of an illustrative embodiment of the present invention.
Figure 8:
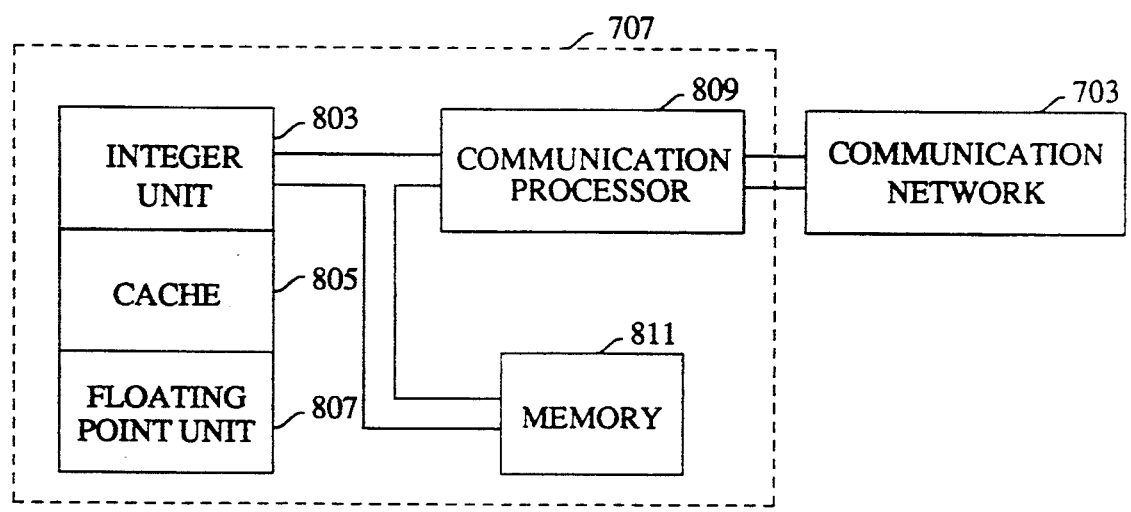
FIG. 8 shows an overview of a processing element as shown in FIG. 7.

FIG. 7 presents an overview of the illustrative embodiment of the invention. It is based on a distributed memory multiprocessor system and consists of three processing elements 707 ("PE"s), a communication network 703 ("CN") that is controlled by a communication network controller 705 ("CNC") and a host 701 processor. In this embodiment there are three PEs but it will be obvious to persons having ordinary skill in the art how to modify the design to have a different number of PEs. In this embodiment, the CNC provides an interface to the host but in other embodiments the host may interface directly with either a PE or a portion of the CN. In this embodiment, the CNC controls the CN and the communication processor 809 within each PE.

Each PE has a communication processor that provides an interface to the communication network, an integer unit that is responsible for address calculation, a floating point unit, a cache for holding the rows just normalized, and random access memory to hold a portion of the matrix. The host processor executes the preprocessing necessary to construct the task graph and a task schedule.

3.3 Operation

An initialization program is executed on the host. Each of the processing elements in the system has an initialization control signal that forces it to read in data from the communication network into memory. Once the program and data have been loaded into the processing elements they can begin to perform tasks.

3.4 The Communication Network Controller (CNC)

Figure 9:
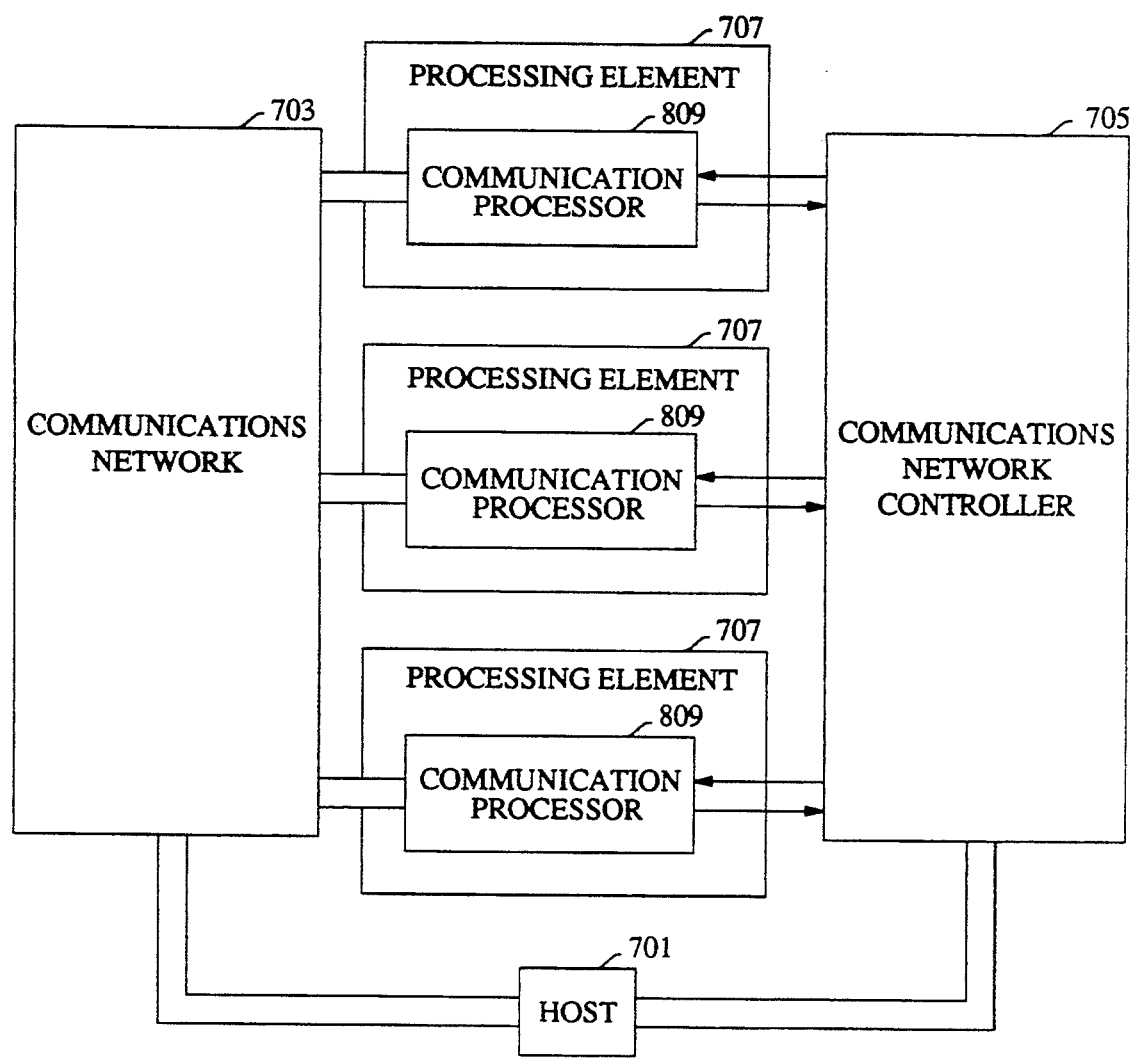
FIG. 9 shows the mechanism for communicating between the processing elements as shown in FIG. 7.

As shown in FIG. 9, the CNC 903 handles communication between the host 909 and the processing elements 905 as well as controlling a sequencing unit. The sequencing unit is within the CNC and takes a communication schedule that was generated during preprocessing. The communication schedule is used to control communication between the processing elements.

3.5 Communication Network (CN)

Recall that the row operations and communications are predetermined prior to execution of the task graph. A processing element 905 can therefore assume that information that it transmits to the communication network 901 will be routed correctly by the communication network controller 903. More specifically, the communication processor 907 within the processing element 905 holds the information until the communication network controller indicates that it may be placed on the communication network.

There are many ways in which the communication network can be implemented. One option includes using a crossbar switch. Other options use ring communication systems or a bus. Simulation studies presented by R. Telichevsky, P. Agrawal and J. Trotter in "Fast Scheduling Schemes for Efficient Sparse Matrix Factorization on Multiprocessors," *I.E.E.E. Proceedings ICCD 91*, Boston (1991), indicate that a bus system running at half the processing elements speed is adequate for 16 processors when as in one embodiment of the invention the Intel I860 microprocessor is used as the processor in the processing element. The bus scheme has the advantage of being easy to implement and being able to broadcast to multiple processing elements.

3.6. The Processing Element (PE)

The Processing Element 707 is the main compute engine for performing tasks simulation process. Hence, it contains a number of resources that are used to communicate and to evaluate the various functions. It has a wide data bus (64 bits) that allows a double precision floating point value to be read in quickly. It contains an 8K data cache, which is enough to hold a source row and its index values. The instruction cache can be used to hold the code for the normalization and the update. The main memory only holds the precompiled instruction list that tells the processor which rows to normalize and update. The integer unit can be operated in parallel with the floating point unit for address calculation. The floating point unit can be used in a pipelined multiply-add mode (this is the core operation of the update), increasing its throughput. The PE must be able to manipulate integers for computing the addresses of the various elements in the data structure. High speed memory or cache is used for storing matrix rows and their indices. A custom VLSI integrated circuit could be specifically designed for these tasks. In another embodiment a special purpose processor with a microcontroller and a high speed specialized floating point unit could be used. Alternately, any of the general purpose microprocessors that have cache storage and a floating point unit could be used.

3.7.1. Integer unit

The integer unit 803 calculates the addresses for the memory system and implements the basic branch and control instructions of the program. The use of the integer unit to calculate the various addresses should not adversely affect the speed of the floating point processor.

3.7.2. Cache

The processing element has a cache 805 large enough to hold the data representing one or more matrix rows. This allows for efficient storage of the source row that is used to update other rows of the matrix with higher row numbers.

3.7.3. Floating Point Unit

The processing element includes a high speed floating point unit 807 to handle all of the necessary arithmetic computations. Double precision is preferred for accurate circuit simulation.

3.7.4. Memory

The memory system allows random access to the data representing the rows in the matrix. Because the memory is accessed randomly and at high speed, static memory is preferred to achieve the fastest possible speed.

3.7.5. Communication processor (CP)

The communication processor 809 is the part of the processing element 707 that provides the interface to the communication network 703. The communication processor contains a bi-directional data buffer which allows the processing element to transmit data to the communication processor and vice versa. The advantage of the buffer is that the processing element can perform computations while the data is queued for transmission to the communication network and while data is being received. The data representing elements in the matrix is transmitted over the communication network in untagged form. Therefore, the processing element relies on the context of the data to indicate its meaning.

Figure 10:
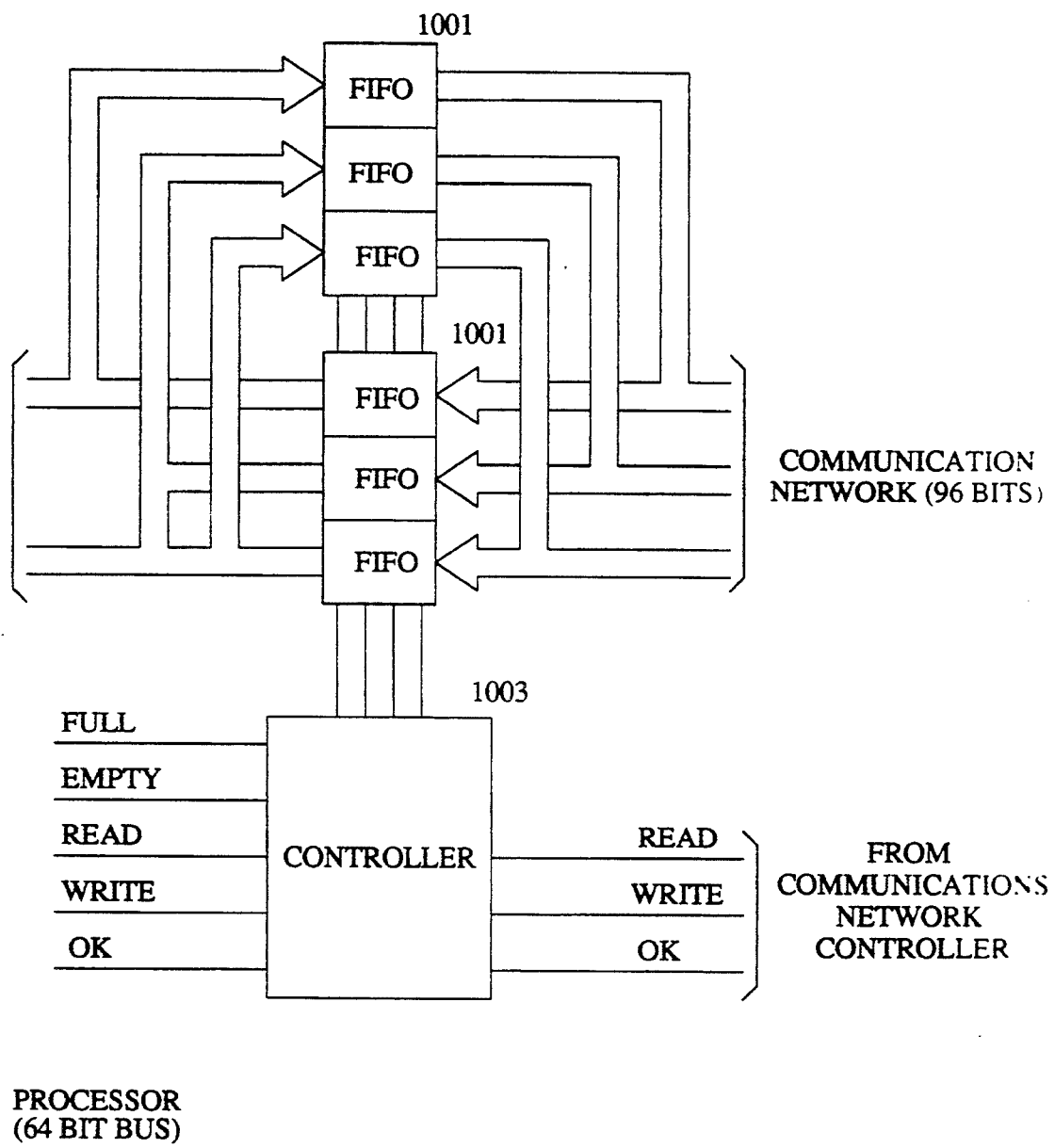
FIG. 10 shows an overview of the communications processor as shown in FIG. 8.

Thus the buffer is implemented as a first-in first-out (FIFO) queue and is shown in FIG. 10. In order to achieve high speed communication, the communication bus is 96 bits wide. In other embodiments the communication bus can have a different width. The processing elements' internal bus is 64 bits wide but can be other widths equal to or not equal to the communication bus width.

4. Scheduling Techniques

The computer described above can be used to solve matrices. Because the computer has three processing elements, each with its own memory, the rows of the matrix are distributed among the various processing elements. Although the operations on each row are somewhat independent there is some information that needs to be communicated between the processing elements. Thus a communication takes place when a processor needs the result of a calculation performed by another processor.

Figure 13:
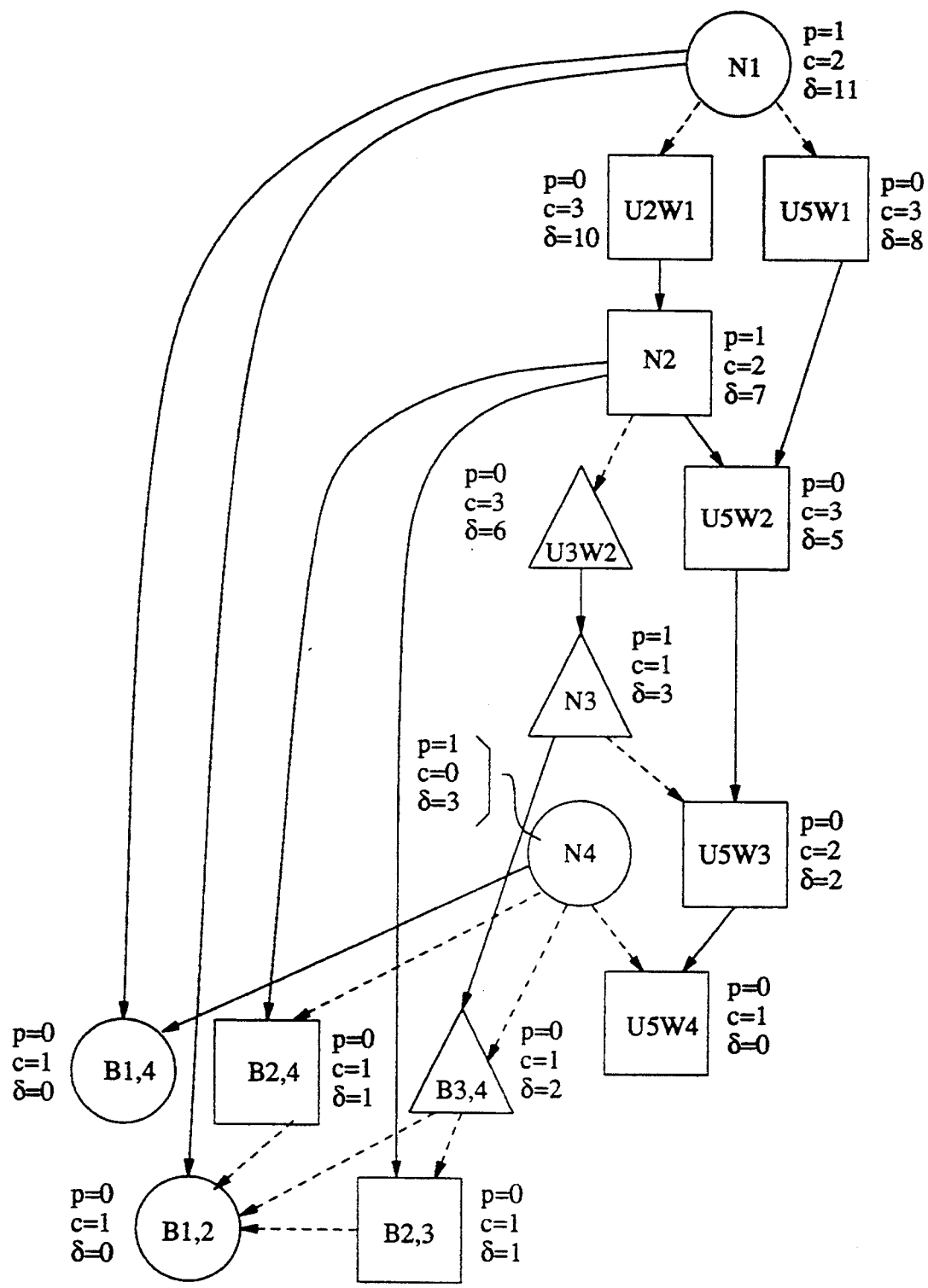
FIG. 13 shows a task graph for solving the augmented matrix in FIG. 3.

FIG. 13 presents a task graph indicating that different tasks are to be executed on different processors. A task performed on the first processing element is represented by a circle. A task performed by the second processing element is represented by a square and a task performed on the third processing element is represented by a triangle. An inter-processing element communication over the communication network is represented in FIG. 13 by a dashed line between tasks.

Figure 14:
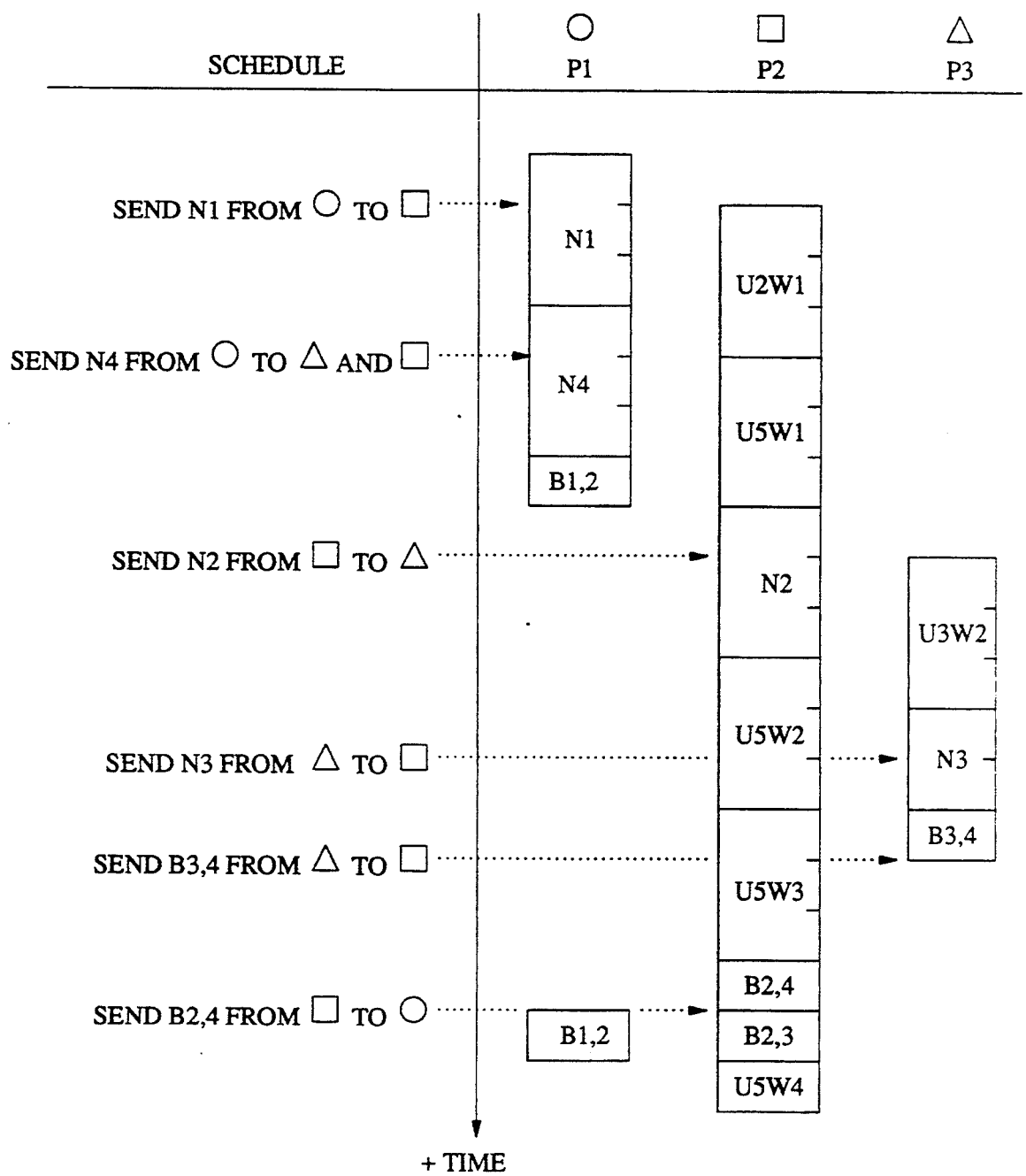
FIG. 14 shows a schedule for task execution corresponding to the task graph in FIG. 13.

A task can be executed when all of the tasks that is dependent upon have been completed. Thus, it is possible to schedule a subset of the tasks to be performed by each of the processing elements. In addition, it is possible to schedule a list of communications that have to occur between processing elements. The set of equations can be solved by providing each processor with a list of tasks it must execute and providing the scheduler with a list of communications, both of which can be obtained from the task graph. FIG. 14 shows the schedule obtained from the task graph of FIG. 13.

The remainder of this section details how the task graph of FIG. 13 and the task schedule of FIG. 14 are constructed given the illustrative problem and the computer of FIG. 7.

4.1 Notations and Definitions

All circuit analysis procedures require the solution of a system of linear equations of the form $A\vec{x}=\vec{b}$, where A is the coefficient matrix containing elements $a_{ij}$, $\vec{x}$ is the unknown vector of circuit variables, and $\vec{b}$ is the excitation vector. The size of the coefficient matrix is directly proportional to the size of the circuit. Most of the entries of A are zero resulting from an extremely sparse set of equations.

We will study here the direct solution of the system of equations $A\vec{x}=\vec{b}$. A represents a sparse matrix of rank n, $\vec{b}$ the right hand side and $\vec{x}$ is the solution vector. In R. Telechevesky, P. Agrawal and J. Trotter in "Efficient Partitioning Schemes for Circuit Simulation Matrix Factorization on Multiprocessors," *Int. Conf. on Applications Specific Array Processors*, Barcelona, Spain (Sept. 1991), we present a brief explanation of the basic operations that are necessary to accomplish this objective and a discussion on the level of granularity in which these basic operations should be represented.

The LU decomposition of the matrix A can be represented as a series of operations of three basic types:

A division, denoted by Dk, is defined as: For k=1, 2, ..., n:

$$p_k \leftarrow \frac{1}{a_{kk}} \quad (1)$$

A row-wise normalization, denoted by Nk, is defined as: For all non-zero $a_{kj}$, $$a_{kj} \leftarrow a_{kj} p_k, \ j > k \quad (2)$$

and the row-wise update, denoted by k→i, corresponding to row i being updated by row k, is defined as:
For all non-zero $a_{kj}$, $$a_{ij} \leftarrow a_{ij} - a_{ik} a_{kj}, \ i,j > k \quad (3)$$

We shall refer to k as a source row and to i as a destination or target or fanout row in Equation 3.

In the literature, the division usually has been considered as the initial phase of the normalization. However, state-of-the-art hardware can perform a floating point division (usually a very costly operation) as a background process, concurrent with multiply-add operations, justifying its treatment as a separate task. Each row-wise normalization or update is implemented in a real processor as a series of elemental multiply-add operations, usually pipelined in order to achieve maximum performance.

These operations can be executed in any sequence, provided the following rules are respected:

i. Nk cannot be started until Dk is completed.
ii. Dk cannot be started unless all update operations that modify $a_{kk}$ are completed.
iii. k→i cannot start before all updates that modify $a_{ik}$ have been completed and
iv. Element $a_{ij}$ in k→i cannot be updated before $a_{kj}$ has been normalized.

Rules (i) through (iii) establish dependencies in the strong sense with respect to row-wise operations, i.e. one operation cannot start fetching operands before the other has finished storing all results, which usually is a bad characteristic for pipelined systems. Rule (iv), however, permits a row update task to start as soon as the first result of the normalize operation is available, provided both pipelines run at the same speed. This rule establishes a new type of dependency which we shall refer to as a mild dependency.

These tasks and the dependencies among them could be conveniently expressed as a generalized multitask graph $G(V, E^s, E^m)$, consisting of a node set V and two arc sets $E^s$ and $E^m$ (corresponding to both strong and mild dependencies). This task graph has no cycles and is a Direct Acyclic Graph (DAG). In order to properly exploit pipelining in a multiprocessor vector machine we suggest the following task model.

Each node $v_i \in V$ corresponds to a pipelined task, as shown in FIG. 14. FIG. 14 depicts the execution of the task in a real processor. The first piece of data enters the pipeline at $t=t_{if}$. After a time delay $p_i$ ($t=t_{of}=t_{if}+p_i$) corresponding to the pipeline latency the result of the first elemental operation is available. After a time $c_i$ ($t=t_{il}=t_{if}+c_i$), which corresponds to the pipeline throughput times the number of elemental operations the last piece of data is fed into the pipeline and the processor is ready to start feeding the pipeline some data corresponding to a new task. At $t=t_{ol}=t_{if}+c_i+p_i$ the result of the last elemental operation is ready and task $v_i$ is finished. If a task $v_j$ depends strongly on $v_i$, it can only start at $t=t_{ol}$, but in the case of a mild dependency, it can start in another processor as early as $t=t_{of}$ or in the same processor as early as $t=t_{il}$. Strong dependencies are represented by $e_{ij}^s$, while mild ones are represented by $e_{ij}^m$.

FIG. 6 shows the task graph that represents the LU Decomposition of the sparse matrix depicted in FIG. 5. We assumed in this case that the pipeline latency is 1 cycle and the throughput is 1 cycle for multiply-add operations and a division (nonpipelined) takes 1 cycle.

A task is called an initial or α-task if it does not depend on any previous operations and is called a terminal or β-task if no task depends on it. We say that $v_i$ depends on $v_j$ if and only if there is at least one directed path $R_k^{j,i}$ that starts at $v_j$ and passes through or terminates at $v_i$. Every task $v_i$ has an associate set of dependency paths $R^{\alpha,i}$. Each element $R_k^{\alpha,i} \in R^{\alpha,i}$ is itself a set of vertices $v_j$ that are traversed in the path that connects $v_i$ to any α-node (and includes them). Furthermore, we can associate with each set $R_k^{\alpha,i}$ an integer function $S(R_k^{\alpha,i})$ that represents the cardinality of $R_k^{\alpha,i}$. A task $v_i$ is said to be at level $h_i$ if among all the paths $R_k^{\alpha,i}$ connecting the initial tasks to $v_i$, the largest one contains $h_i$ elements, or $$h_i = \max_k \{S(R_k^{\alpha,i})\} \; \forall \; R_k^{\alpha,i} \in R^{\alpha,i}. \tag{4}$$

The height H of a task graph is defined as the level of the vertex at the highest level, or $$H = \max_i \{h_i\} \; \forall \; i \; | \; v_i \in V \text{ is a terminal node}. \tag{5}$$

Clearly, the height of the task graph is associated with the minimal completion time of the matrix decomposition. Task graphs that are short and stout are expected to exploit parallelism better than those that are tall and skinny. In the example in FIG. 6, the height of the task graph is seven. However, just the level of the task is not enough to properly model some hardware features and different task sizes, so we introduce the concept of the completion time $d_i$ of a given task $v_i$, which is defined as follows:

$$d_i = \max_k \left( \sum_{j=a}^{i} (\text{cost}(v_j)) \; \forall \; v_j \; | \; v_j \in R_k^{\alpha,i} \right) \tag{6}$$

where $R_k^{\alpha,i}$ is any path starting at an α-node and finishing at $v_i$ and cost($v_j$) can be either $c_j$ (resource cost), $p_j$ (pipeline latency time) or even $c_j+p_j$, depending on the type of the dependencies on $v_j$ that occur while traversing the path $R_k^{\alpha,i}$. The earliest completion time D for the decomposition is defined as the completion time of the node with the largest $d_i$, or $$D = \max_i \{d_i\} \; \forall \; i \; | \; v_i \in V \text{ is a terminal node}. \tag{7}$$

We can also define the critical path $R_c^{\alpha,i}$ as the path whose total cost $d_i=D$. Notice that in the case of a mild dependency the cost of a parent node is only its latency. The earliest completion time establishes the first barrier on the available concurrency for a given matrix and cost function. The partitioning bound is usually more restrictive than the critical path bound for row-wise operations. Nevertheless, the critical path plays an important role in the scheduling algorithm, as it seems natural that tasks that belong to the critical path should be executed before other less important tasks. The last definition we need for our scheduling algorithm is the remaining completion time, $\delta_i$, for a given task $v_i$. Assuming $v_j$ is a terminal task and there is at least one path $R_k^{i,j}$, we define $\delta_i$ as:

$$\delta_i = \max_k \left( \sum_{p=i}^{j} (\text{cost}(v_p)) \; \forall \; v_p \; | \; v_p \in R_k^{i,j} \text{ and } v_p \neq v_i \right) \tag{8}$$

The remaining completion time is actually a measure of how important is the early execution of a given task, as it is known that once the task $v_i$ is finished, the minimum time for completion of all the tasks that depend upon $v_i$ is $\delta_i$. Clearly $\delta$ for β-tasks is zero. In the following we shall describe an algorithm for computing the remaining completion time for the entire task graph in linear time and a quasi-linear time scheduling scheme based on δ-techniques.

4.2 Scheduling Schemes

In a multiprocessor environment there are two major factors that heavily influence the utilization of computational resources during the sparse matrix factorization.

The first is the allocation of data to the processors and the second is the task scheduling within each processor and in the communication network. Earlier in R. Telichevesky, P. Agrawal and J. Trotter in "Efficient Partitioning Schemes for Circuit Simulation Matrix Factorization on Multiprocessors," *Int. Conf. on Applications Specific Array Processors*, Barcelona, Spain (Sept. 1991), we studied several partitioning algorithms and empirically demonstrated that the load balancing scheme yields nearly optimal partitions with respect to overall efficiency. Two scheduling techniques were used in conjunction with various partitioning techniques. One of them is a simple-minded level-based technique presented by J. Trotter and P. Agrawal in "Circuit Simulations Algorithms on a Distributed Memory Multiprocessor System," *I.E.E.E. Int. Conf. on Computer Aided Design*, Santa Clara, Calif., pp. 438–441 (Nov. 1990) and the other a greedy scheduling technique. In the level-based technique, all tasks scheduled at a level are completed before proceeding to execute the tasks at the next level. The processors operate in a lock-step fashion. Obviously, some performance is lost as processors may have to wait although there are tasks ready for execution. A simple greedy scheduling mechanism, described later, produces results that are better than the level-based technique. However, it too falls short of the theoretical maximum performance imposed by the partitioning algorithm.

In order to improve the utilization of the system, a good scheduling algorithm should be able to choose among the enabled tasks the most critical and schedule it to be executed first. V. Sarkar in "Partitioning and Scheduling Parallel Programs for Execution on Multicomputers," *The MIT Press*, 1989, proposed an algorithm based on critical path scheduling that produces very good results. In his scheme, the first scheduled tasks are in the critical path. Next, each branch is analyzed and the local critical path is scheduled in a recursive fashion. Unfortunately, the time complexity of this algorithm is $O(E(V+E))$ where E and V are, the number of edges and the number of vertices in the task graph, respectively. E represents the dependencies and V, the number of of row-wise operations present in the task graph. For large task graphs the scheduling time quickly becomes prohibitive.

Two new scheduling techniques are based on the remaining completion time ($\delta$). In these schemes, tasks with larger $\delta$ are scheduled to be executed before the others, as tasks in the critical path or in heavier branches tend to have a larger $\delta$ than others. The net effect of this scheduling is not as good as Sarkar's, but at a much smaller cost, as $\delta$ can be computed for the entire task graph in linear time. In the following, we show how to compute $\delta$, then introduce two scheduling techniques based on $\delta$-techniques and finally present experimental results. For the sake of comparison, we begin by describing the greedy scheduling technique described in R. Telichevesky, P. Agrawal and J. Trotter in "Efficient Partitioning Schemes for Circuit Simulation Matrix Factorization on Multiprocessors," *Int. Conf. on Applications Specific Array Processors*, Barcelona, Spain (Sept. 1991).

4.2.1 A Greedy $O(E)+O(V)$ Scheduling Heuristic

The greedy technique works as follows. Each processor will execute all assigned tasks that are ready for execution, i.e., all tasks on which it depends on have already finished. Otherwise, the processor will stall. This technique is very fast and yields in almost all cases better results than the level approach. However, it requires a more complex synchronization mechanism among processors. In the following, we give a brief description of the technique.

We associate with each task $v_j$ the number of dependencies $d_j$ that must be satisfied before $v_j$ is enabled. Clearly, for initial tasks $d_j=0$. We also associate with $v_j$ a timestamp $t_j$ which represents the earliest time the task can be executed considering its data dependencies and the processor allocation. In the beginning of the technique all $t_j=0$. When the technique finishes, each $t_j$ will contain the starting time for the execution of the task $v_j$. Each processor p has a local timer $f_p$ which holds the time in which the last scheduled task was completed. The technique starts after the task graph is built, all $d_j$ are properly set, all $f_p=0$ and the data is properly distributed using the load balancing partitiong technique descibed in R. Telichevesky, P. Agrawal and J. Trotter in "Efficient Partitioning Schemes for Circuit Simulation Matrix Factorization on Multiprocessors," *Int. Conf. on Applications Specific Array Processors*, Barcelona, Spain (Sept. 1991).

1. For each processor p visit all tasks $v_j \in Q_P$ such that $d_j=0$. For each visited task $v_j$ do:
    (a) Schedule $v_j$ at time $t_j=\max(t_j,f_p)$.
    (b) Set the local timer in processor p at $f_p=t_j+C(v_j)$.
    (c) Visit all tasks $v_i$ that depend upon the completion of $v_j$, i.e. $\exists e_{ij}$. For each visited $v_i$ do:
        i. Set $t_i=\max(t_i, f_p)$.
        ii. Set $d_i=d_i-1$.
2. Repeat step 1 until all the tasks have been scheduled in all processors.

We define the completion time for the greedy algorithm $t_G$, as the maximum value of $f_p$ when the scheduling finishes. We can define also the greedy scheduling utilization $\eta_G$ as:

$$\eta_G = \frac{T}{t_G \cdot P} \qquad (9)$$

4.2.2 Computing Remaining Completion Time in $O(V)+O(E)$

We assume that in the beginning of the technique the task graph is levelized and each node $v_i$ contains a list of tasks $v_j$ on which it depends. The dependencies correspond to the arc directions that are opposite to those shown in FIG. 6. Initially, we set $D=0$ and each node $v_i$ will contain $\delta_i=0$. The levels in the task graph range from 1 to H, H being the highest level. The technique proceeds as:

1. At each level k starting from k=H towards k=1 visit all nodes $v_i$ such that $h_i=k$. For each node $v_i$ do:
    (a) Set $\delta_s=\delta_i+c_i+p_i$.
    (b) Traverse all arcs $e_{ji}{}^s$ in the reverse direction and set $\delta_j=\max(\delta_j,\delta_s)$.
    (c) Traverse all arcs $e_{ji}{}^m$ in the reverse direction and:
        i. Set $\delta_m=\delta_s-c_j$.
        ii. Set $\delta_j=\max(\delta_m,\delta_i,\delta_j)$.
    (d) Set $D=\max(D,\delta_s)$.

At the end of the technique execution all nodes $v_i$ will be set to $\delta_i$ and D will be set to the earliest completion time. If desired, we could annotate in 1(b) and 1(c) the edge that caused $\delta_j$ to be maximum as the critical edge $e_j{}^c$. This set of critical edges form the critical path and its branches.

4.2.3 Vertical $O(V \log V)$ Scheduling Heuristic

We associate with each task $v_i$ the remaining completion time $\delta_i$ as computed in Section 4.2.2. We also associate with each $v_i$ a timestamp $t_i$ which represents the earliest time the task can be executed considering its data dependencies and the processor allocation. Finally, each node contains information about the number of dependencies $nd_i$ that must be satisfied before $v_i$ is enabled. Each processor p has a local timer $f_p$ which holds the time the last scheduled task is completed. An auxiliary $t_v$ register will contain the total time necessary to complete the decomposition. The technique described here is divided into two phases, the first is the actual scheduling and the second is the computation of timestamps for simulation purposes only. The technique starts after the task graph is built, all $\delta_i$ and $nd_i$ are properly set, all $f_p=0$, all $t_i=0$, $t_v=0$ and the data is distributed according to some partitioning technique.

1. In each processor sort the tasks in decreasing order of $\delta$ (O(V log V) step). The scheduling is done. Theorem 1 shows that the resulting schedule is deadlock-free.
2. For each processor p visit the next scheduled task $v_i$. For each visited task $v_i$ do:
   (a) If $nd_i \neq 0$ go to another processor, else proceed.
   (b) Set $t_i = t_{if} = \max(t_i, f_p)$.
   (c) Set $t_{ol} = t_{if} + c_i + p_i$.
   (d) Set $t_{of} = t_{if} + p_i$.
   (e) Set $f_p = t_{il} = t_{if} + c_i$.
   (f) Traverse all arcs $e_{ij}^s$ and for each visited $v_j$ that depends strongly on $v_i$ do:
      i. Set $nd_j = nd_j - 1$.
      ii. Set $t_j = \max(t_j, t_{ol})$.
   (g) Traverse all arcs $e_{ij}^m$ and for each visited $v_j$ that depends mildly on $v_i$ do:
      i. Set $nd_j = nd_j - 1$.
      ii. Set $t_j = \max(t_j, t_{of})$.
   (h) Set $t_v = \max(t_{ol}, t_v)$.
3. Repeat Step 2 until all tasks are visited.

The scheduling scheme proposed in Step 1 is so simple that one might ask if it is correct, as it is not obvious that it will generate deadlock-free code. The following proof, by contradiction provides necessary and sufficient conditions for a deadlock-free code:

Theorem 1 This proof is divided into three parts, the first corresponding to the uniprocessor case and the remaining two treat interprocessor deadlocks.

(a) Suppose two tasks $v_i$ and $v_j$ are in the same processor and $v_i$ depends on $v_j$. A deadlock can occur if and only if $v_i$ is scheduled to be executed before $v_j$. However, if $v_i$ depends on $v_j$ there must be at least one directed path $R_p^{j,i}$ and therefore $$\delta_j = \delta_i + \sum_{k=j}^{i} \text{cost}(v_p)$$

provided $v_p \in R_p^{j,i}$ and $v_p \neq v_j$. Assuming $\text{cost}(v_p) > 0$, otherwise not physically possible. $\delta_j > \delta_i$ and $v_j$ will be scheduled to be executed before $v_i$, which contradicts the initial deadlock hypothesis.

(b) Suppose $v_i$ and $v_j$ are in a processor $p_r$ and $v_m$ is in processor $p_s$. An interprocessor deadlock can occur if and only if $v_m$ depends on $v_j$ and $v_i$ depends on $v_m$, but $v_i$ is scheduled to happen before $v_j$. Using the same arguments as in part (a) we can say $\delta_j > \delta_m$ and $\delta_m > \delta_i$. Using transitivity $\delta_j > \delta_i$, which finishes the proof of the theorem by the same arguments as in (a).

(c) By induction on (b) we can prove that there will be no deadlocks in any number of processors.

Even though the above technique produces deadlock-free schedules, there is one obvious drawback. This is because there is a possibility that some processors may be idle waiting for data to arrive from another processor inspire of enabled tasks being present. The next Section will present a modified version of the vertical scheduling technique which will reduce processor idle time by introducing some greediness.

4.2.4 $\delta$-Greedy O(V log V) Scheduling Scheme

This technique is based on the same assumptions we made in Section 4.2.3, but we add a greedy element in this scheme. Since the greedy and the $\delta$ techniques are conflicting, we need to create a compromise between them, quantitatively in the form of a scheduling elasticity $\kappa$, which is discussed next.

Figure 12:
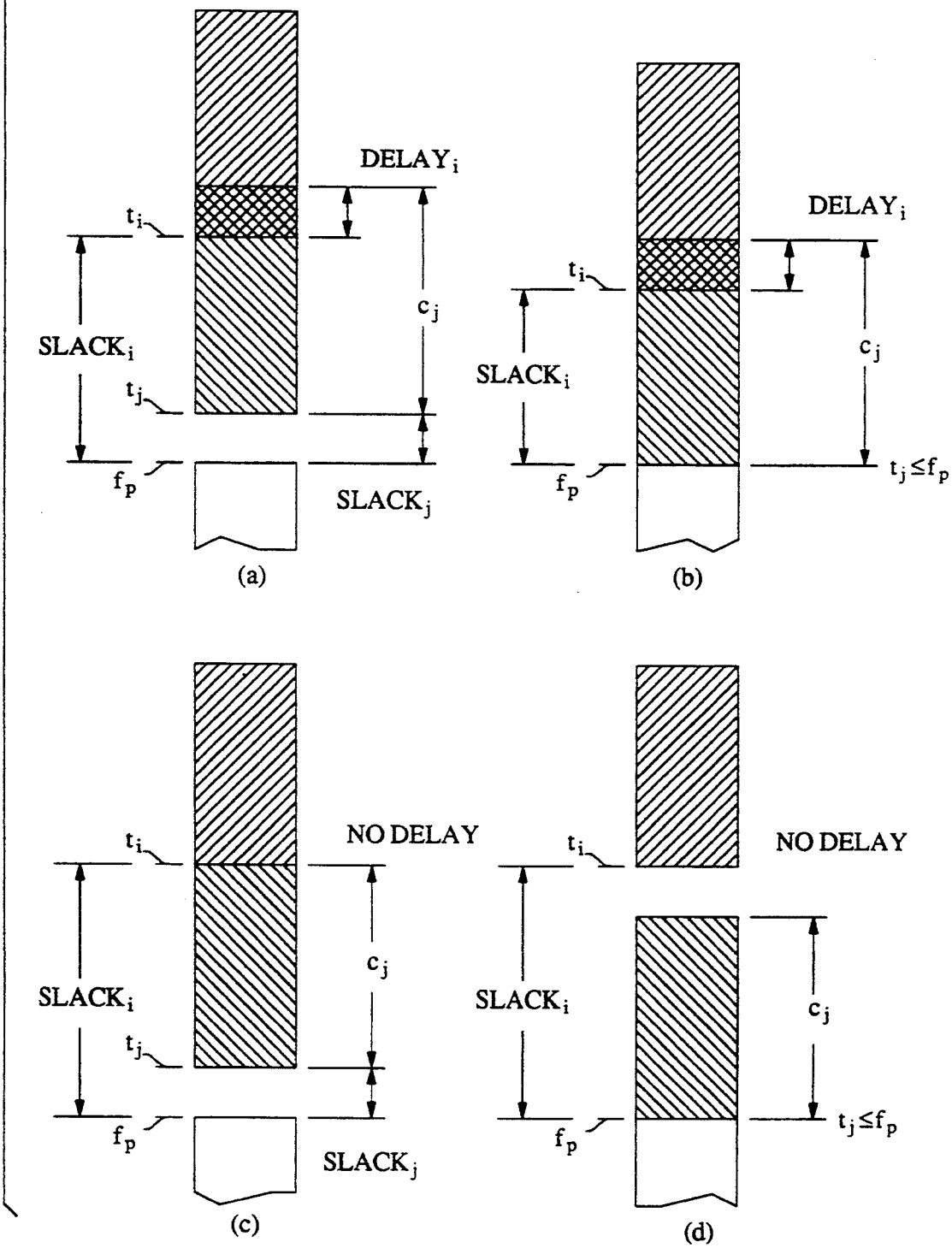
FIG. 12 shows options for inserting tasks into the task schedule.

In Step 2(b) in Section 4.2.3 we set $t_{if} = \max(t_i, f_p)$. This code means that $v_i$ cannot start before it is enabled by the completion of tasks it depends upon ($t_i$), or before the processor is ready to execute it ($f_p$), whichever occurs last. If $t_i > f_p$ the processor stalls. However, there might be another task $v_j$ such that $t_j < t_i$, but $\delta_j < \delta_i$ and $nd_j = 0$. In this case, we could execute $v_j$ before $v_i$ in order to reduce the slack. FIG. 12 depicts four possible timing situations, which might occur if we try to insert $v_j$ before $v_i$.

Figure 11:
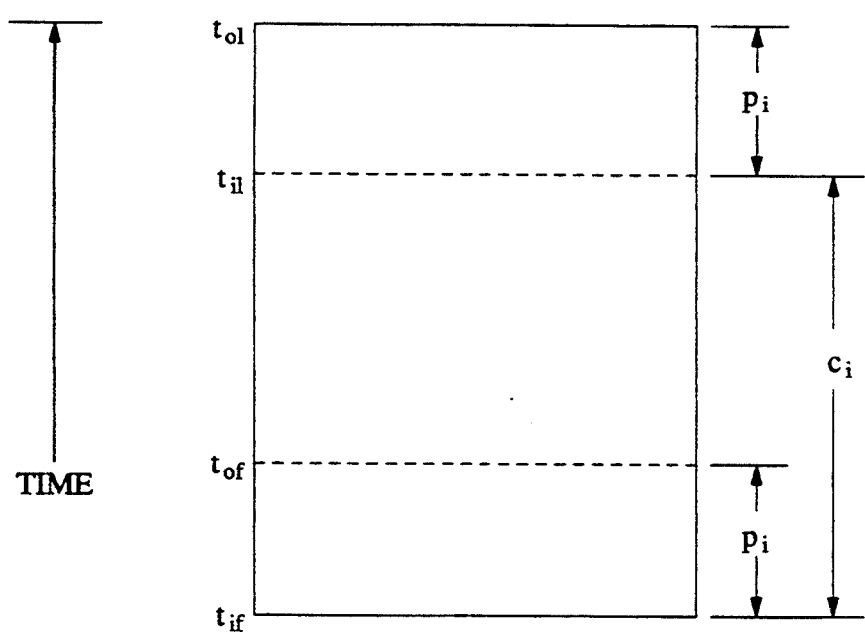
FIG. 11 shows a temporal representation of a task to be performed by the illustrative embodiment.

In (a) and (c) $t_j > f_p$ and therefore there is still a little slack left, while in (b) and (d) $v_j$ causes no slack. In (a) and (b) the insertion of $v_j$ causes the beginning of $v_i$ to be delayed, while in (c) and (d) there is no delay involved, since the inserted task finishes before $v_i$ is enabled. The technique used to decide whether or not insert a task $v_j$ depends on $\kappa$, so if the condition $$\frac{\text{slack}_j + c_j}{\text{slack}_i} < \kappa \tag{10}$$

is satisfied, we insert $v_j$ before $v_i$. If $\kappa < 0$ no insertion is permitted and the technique yields the same results as the vertical scheduling. If $\kappa \leq 1$ no conflict happens between the $\delta$-technique and the greedy technique. In this case, the insertions depicted in FIG. 11 parts (a) and (b) are not allowed. If $\kappa > 1$ there is a compromise between the greedy technique and the $\delta$-based scheme.

The technique is basically the same as described in Section 4.2.3, with exception of line 2(b) which is substituted by the following procedure:
1. If $t_i \leq f_p$ set $t_{if} = f_p$ and return.
2. Set $v_s = v_i$, $\text{slack}_s = \text{slack}_i = t_i - f_p$.
3. Visit all tasks $v_j$ that are enabled in processor p ($nd_j = 0$). For each visited task do:
   (a) Set $\text{slack}_j = \max(t_j - f_p, 0)$.
   (b) If ($\text{slack}_j < \text{slack}_s$) and ($\text{slack}_j + c_j < \kappa \cdot \text{slack}_i$) do:
      i. Set $\text{slack}_s = \text{slack}_j$.
      ii. Set $v_s = v_j$
      iii. If $\text{slack}_s = 0$ finish the search.
4. If $v_s = v_i$ set $t_{if} = t_i$ and return (search failed).
5. Schedule $v_s$ before $v_i$, set $t_{if} = f_p + \text{slack}_s$ and return.

4.2.5 Simulation Results and Discussion

In section 4.2.3 we computed $t_v$, the completion time for the vertical technique. A similar procedure could be used for computing $t_{\delta G}$ for the $\delta$-greedy technique. If P is the number of processors and T is the sequential execution time, we represent the scheduling utilizations for the vertical and $\delta$-greedy techniques and for the optimal partitioning by $\eta_v$, $\eta_{\delta G}$ and $\eta_{opt}$, respectively.

$$\eta_V = \frac{T}{t_V \cdot P} \quad (11)$$

$$\eta_{\delta G} = \frac{T}{t_{\delta G} \cdot P} \quad (12)$$

$$\eta_{opt} = \frac{T}{t_{opt} \cdot P} \quad (13)$$

$t_{opt}$ is computed as follows:

$$t_{opt} = \max_i \left( \sum_j C(v_j) \right) \quad (14)$$

where $\Sigma_j C(v_j)$ represents the total execution time of the tasks $v_j$ that have row i as destination. $t_{opt}$ represents the barrier to the amount of parallelism available during the LU decomposition and corresponds to the minimum completion time due to partitioning. This can be easily computed for each row of the matrix by determining the dependencies and the number of operations needed to update a given row.

Table 1 lists the simulation results for the LU decomposition using the techniques previously described. In the case of the level-based and greedy scheduling we reproduce the results reported in our previous work. R. Telichevesky, P. Agrawal and J. Trotter in "Efficient Partitioning Schemes for Circuit Simulation Matrix Factorization on Multiprocessors," *Int. Conf. on Applications Specific Array Processors*, Barcelona, Spain (Sept. 1991). In order to produce a fair comparison of the techniques, we used a very simple cost function, in which each elemental operation takes 1 cycle and we assume no pipelining ($p_i=0$ for all i).

The vertical scheduling yields poor results in most cases, since the code generated results in too much slack among the tasks. However, when we approach the bound of the minimum completion time using many processors (in this case there is a lot of slack anyways), the technique tends to generate nearly optimal results, as shown in the table for feb and omega for more than 8 processors.

In contrast, the δ-greedy scheduling yields better results in 80% of the cases, as it combines the advantages of both the vertical and the greedy schemes. The only two cases in which the bare greedy technique outperforms the δ-greedy is for iir12 and mfr with a moderate number of processors. In these examples the critical path does not play an important role, as efficiency is dominated by the greedy allocation of tasks with a minimum slack. In all cases we computed κ according to:

$$\kappa = \frac{3 \cdot \text{total cost}}{D \cdot P} \quad (15)$$

As P increases we shall have more slack available, thus we shall permit less changes in the vertical ordering. As the ratio between the total cost and the size of the critical path increases we shall pay less attention to the vertical ordering and increase the chances for insertions.

The results presented in this section are valuable for the comparison of different techniques. However, the cost functions that they represent are not realistic. In the next section we present the results of several simulations involving real cost functions in order to compare the performance of state-of-the-art microprocessors connected through a high bandwidth network.

4.3 Architecture Evaluation

If the processors are connected through a high speed bus a simple modification of our task graph allows its simulation. First, we add a broadcast task Bi, that mildly depends on the normalizations, provided the throughput of the bus is the same as the normalization pipeline. Then we change the dependencies of the updates; the dependency on the proper source row normalization will be replaced by the proper source row broadcast. Finally, we force the processor that is allocated to the row in question to broadcast the row using the bus. There are several advantages for the usage of this model. First, it is consistent with the general task model. Hence, any scheduling technique can be executed with no modifications. Second, the bus transactions could be scheduled automatically according to their importance, as they have information on the remaining completion time as any other tasks. Finally, if the system is carefully designed we can use the bus as a pipelined device avoiding complex buffering schemes and the overhead they

TABLE 1

Comparison of Different Scheduling Schemes

| matrix | P | Level | $\eta_G$ | $\eta_V$ | $\eta_{\delta G}$ | $\eta_{opt}$ |
|---|---|---|---|---|---|---|
| feb | 2 | 0.88 | 0.91 | 0.85 | 0.95 | 1.00 |
| (n = | 4 | 0.71 | 0.87 | 0.74 | 0.87 | 1.00 |
| 10060) | 8 | 0.51 | 0.61 | 0.63 | 0.82 | 1.00 |
| | 16 | 0.33 | 0.38 | 0.60 | 0.60 | 0.60 |
| | 32 | 0.19 | 0.22 | 0.30 | 0.30 | 0.30 |
| | 64 | 0.11 | 0.13 | 0.15 | 0.15 | 0.15 |
| iir12 | 2 | 0.97 | 0.99 | 0.93 | 1.00 | 1.00 |
| (n = | 4 | 0.91 | 0.99 | 0.85 | 1.00 | 1.00 |
| 7310) | 8 | 0.83 | 0.89 | 0.74 | 0.87 | 1.00 |
| | 16 | 0.70 | 0.77 | 0.53 | 0.75 | 1.00 |
| | 32 | 0.52 | 0.64 | 0.43 | 0.68 | 1.00 |
| | 64 | 0.37 | 0.50 | 0.32 | 0.56 | 1.00 |
| mfr | 2 | 0.96 | 0.99 | 0.90 | 1.00 | 1.00 |
| (n = | 4 | 0.85 | 0.89 | 0.79 | 0.93 | 1.00 |
| 5496) | 8 | 0.72 | 0.87 | 0.66 | 0.82 | 1.00 |
| | 16 | 0.53 | 0.74 | 0.55 | 0.72 | 1.00 |
| | 32 | 0.36 | 0.52 | 0.45 | 0.60 | 0.85 |
| | 64 | 0.22 | 0.30 | 0.32 | 0.42 | 0.42 |
| omega | 2 | 0.85 | 0.78 | 0.82 | 0.92 | 1.00 |
| (n = | 4 | 0.61 | 0.70 | 0.71 | 0.84 | 1.00 |
| 4212) | 8 | 0.39 | 0.44 | 0.65 | 0.74 | 0.74 |
| | 16 | 0.23 | 0.27 | 0.37 | 0.37 | 0.37 |
| | 32 | 0.12 | 0.16 | 0.18 | 0.18 | 0.18 |
| | 64 | 0.07 | 0.08 | 0.09 | 0.09 | 0.09 |

TABLE 2

Matrix Factorization Time for DRAM (ms)

Figure 15:
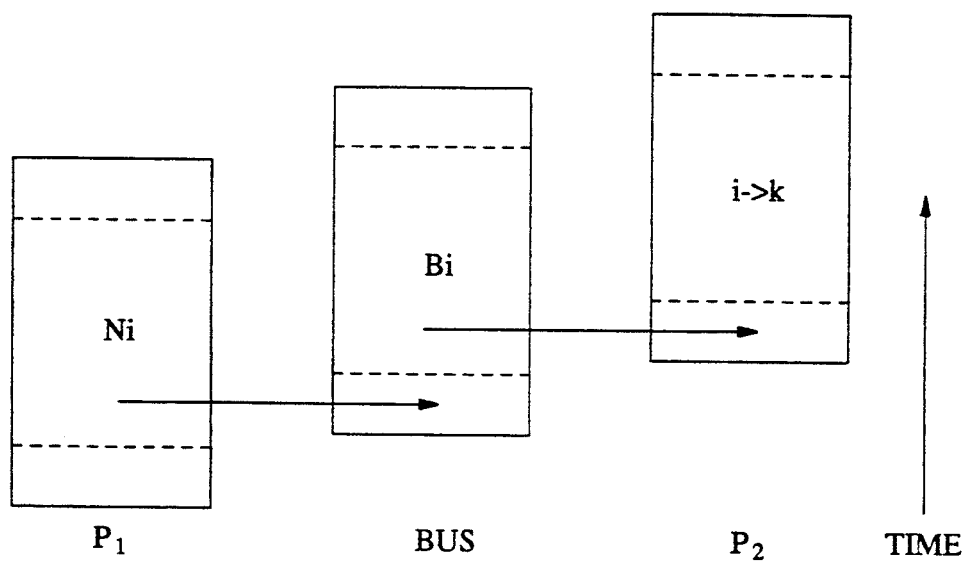
FIG. 15 shows the timing of a pipelined bus operation on the illustrative embodiment.
Figure 19:
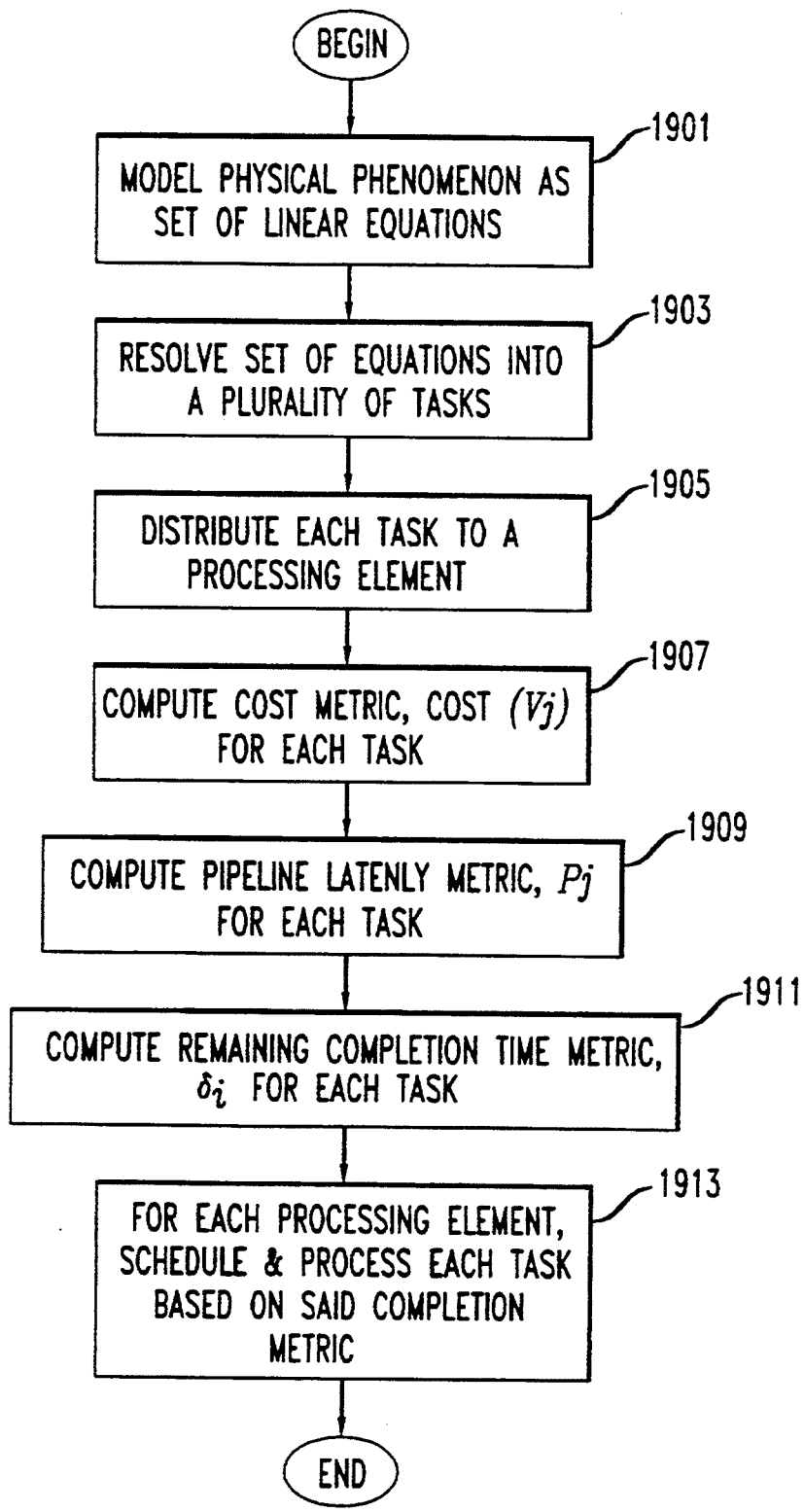
FIG. 19 is a flowchart that depicts the overall method for task scheduling and processing.

| P | i860 | $W_g$ | $W_s$ | $B_g$ | $B_s$ |
|---|---|---|---|---|---|
| 1 | 151.8 | 233.4 | 49.11 | 46.41 | 9.841 |
| 2 | 75.91 | 120.0 | 24.56 | 23.54 | 4.904 |
| 4 | 39.18 | 61.49 | 12.32 | 12.10 | 2.442 |
| 8 | 20.24 | 32.85 | 6.205 | 6.460 | 1.226 |
| 16 | 11.12 | 18.75 | 3.569 | 3.703 | 0.694 |
| 32 | 6.233 | 9.958 | 1.992 | 1.903 | 0.401 |
| 64 | 4.781 | 6.155 | 1.615 | 1.238 | 0.334 | introduce in the system. In order to better illustrate this concept, consider the timing diagram depicted in FIG. 15. Assume that processor $p_i$ is executing a normalization Ni while $p_2$ needs the data generated by Ni in order to perform a row update i→j. If these tasks are critical, the bus can be scheduled to act as a pipe between the two tasks, getting data out of the pipeline on processor $p_1$ and feeding it to the pipeline on processor $p_2$. This model not only provides us accurate information on the actual performance of the system, but also improves the usage of the communication resources.

Once we have properly modeled the hardware characteristics of hypothetical architectures we compared their performance using a benchmark circuit matrix that represents part of a dynamic ram memory. Table 2 contains the results, in mill-seconds for different hardware configurations. i860 represents a system built with Intel i860 processors running at 40 Mhz. $W_g$ and $W_s$ represent systems built with a Weitek FPU and general purpose controller or a special purpose controller running at 20 Mhz. $B_g$ and $B_s$ represent systems that contain a Bit FPU and a general or special purpose controller running at a 100 Mhz, if it could be built. For the Bit FPU we changed the scheduling algorithm in order to properly model the Division Unit available in the chip. In all cases we model the bus as having the same throughput as the floating point pipeline within the processor. For the sake of comparison, the factorization of the same matrix on a Cray X-MP Supercomputer takes 59.8 ms, while in a Sun 4 Workstation takes 19420 ms. The results obtained here are an incentive to the design and construction of such a machine.

4.4 Conclusion

Sparse matrix decomposition task is known to be very difficult to parallelize. This is evidenced by the lack of parallel computers or special purpose accelerators that are employed for solving this problem. Because of the compute-intensive nature of the problem, often large circuits are simulated on fast but expensive supercomputers. In this paper, we have addressed the problem of employing less expensive distributed memory multiprocessors for factorizing large sparse circuit simulation matrices. However, these systems require efficient matrix data partitioning and task scheduling algorithms. In R. Telichevesky, P. Agrawal and J. Trotter in "Efficient Partitioning Schemes for Circuit Simulation Matrix Factorization on Multiprocessors," *Int. Conf. on Applications Specific Array Processors*, Barcelona, Spain (Sept. 1991), we have addressed the data partitioning problem that focussed on increasing data locality and processor utilization and reduced interprocessor communication. The new and efficient task scheduling techniques, based on the remaining completion time, when coupled with our partitioning techniques produce theoretically predicted and near-optimal processor utilization. Our simulation studies of sparse matrices of large circuits, assuming a system of state-of-the art microprocessors, reinforce the theoretical results. Our data partitioning and task scheduling techniques are very simple and yet dramatically faster than previously known methods.

5. Solving the Illustrative Problem

The circuit of FIG. 1 can be modeled by the set of equations shown in FIG. 2 which are also represented in matrix form as shown in FIG. 3. The zero/non-zero structure of the matrix, shown in FIG. 5, is used to determine the normalization, update and back-substitution tasks necessary to solve the set of equations represented by the matrix. These tasks can be scheduled to allow more than one processing element in a multiprocessing system to execute the tasks in parallel. Recall that the tasks are based on row level operations and therefore whole rows of the matrix are distributed amongst the respective processing elements.

This partitioning, is based upon methods taught by R. Telichevesky, P. Agrawal and J. Trotter in "Efficient Partitioning Schemes for Circuit Simulation Matrix Factorizarion on Multiprocessors," *Int. Conf. on Applications Specific Array Processors*, Barcelona, Spain (Sept. 1991). The method fixes the set of tasks which to be executed by an individual processing element. Once this task partitioning is done the tasks can be scheduled on the computer. In the task graph of FIG. 13, a dashed line between tasks indicates that a data communication has to take place over the communication network between the respective processing elements.

An aspect of the illustrative embodiment of the invention, ("the scheduler"), first assigns a cost to each task in the task graph. FIG. 13 depicts a task graph with cost values of p and c associated with each task. For example, the cost, p, of the N1 task is 1 because the results of task N1 become available for use by other tasks after one time unit. The total cost of a task is equal to p plus c which is represented by the length in time of the associated rectangle as shown in FIG. 14. Based on these costs it is possible to calculate a metric, $\delta$, called the "earliest completion time." This metric indicates the least amount of time in which the rest of the task graph could be computed were there an infinite amount of processing resources available. A value of $\delta$ is assigned to each task in the graph beginning at the terminal tasks (e.g., task B2,3) and proceeding toward the initial tasks (e.g., task N1 and task N4). The value of $\delta$ for a given task is determined by adding the maximum of the $\delta$ values of the tasks which depend on the given task to the cost of the given task. For example, as shown in FIG. 13, $\delta$ for the task U5W2 is calculated by adding its cost ($c+p=3+0=3$) to the maximum $\delta$ value of the tasks dependent upon it, the U5W3 task, which has a $\delta$ of 2.

The $\delta$ of task N1 can be determined by taking the maximum of the $\delta$s for tasks U2W1 ($\delta=10$), U5W1 ($\delta=8$), B1,4 ($\delta=0$) and B1,2 ($\delta=0$), the maximum being equal to 10, and adding this to the cost of the N1 task which is 1 because the tasks U5W1 and U2W1 depend mildly the N1 task giving a $\delta$ for N1 of 11. Once the $\delta$s have been calculated for all of the tasks in the task graph they are sorted in decreasing value of $\delta$. The schedule is then derived by taking the set of tasks that are to be executed on each processing element, and for that processing element scheduling the tasks to be executed in reverse order of $\delta$. When there is time between the completion of a given task and the next task could be scheduled, then an attempt is made to schedule a another task to be executed in the interim. This procedure continues until all of the tasks on all the processing elements have been scheduled. Additionally, a schedule of communications is determined which is used by the communication network controller to sequence the communications on the communication network. FIG. 14 shows a schedule of the tasks to be executed for each of the three processors and the sequence of communications that is necessary to communicate the data between processing elements.

Once the task schedule has been generated for each of the processors the computer is used to solve the equations. A list of the tasks and the instructions necessary to execute those tasks is transmitted from the host to each of the processing elements. The rows of the matrix are transmitted from the host to the respective processing elements responsible for operating on the row. A list representing the sequence of communications to be carried by the communication network is transmitted from the host to the communication network controller.

As is shown in FIG. 14, the first task executed is N1 (i.e., the normalization of row 1) on processing element P1 (represented by a circle). The values in the matrix after this task has been completed are shown in FIG. 16. The result of the N1 task is transmitted by P1 to processing element P2, represented by a square. Note that the scheduling of the transmittal is dictated by the communication network controller. Next, task U2W1 depends on the data generated by task N1 and can start executing as the data becomes available. The task U5W1 is executed next on P2 and it uses the same data transmitted from P1 previously. The values of the matrix after these three tasks have been executed is shown in FIG. 17.

Note that the data from task N4, generated on processing element P1 is needed by both P2 and P3 to execute tasks B2,4, B3,4 and U5W4. In this case the communication network controller causes the data to be broadcast to both the processing elements P2 and P3. Eventually, all of the tasks are completed and the memory of the processing elements contains, in aggregate, the solution vector (i.e., the solution to the set of equations). The matrix of FIG. 18 shows the matrix after all the tasks have been executed and the solution vector is then the last column of the matrix. This is read from the computer by the host.

As shown in FIG. 18 in the last column, the voltages for $V_2$ and $V_3$ are determined to be 1.95 and 1.77 volts respectively.

What is claimed is:

1. A method of scheduling the processing of a plurality of tasks, $v_j$, in a multiple instruction stream-multiple data stream computer comprising a plurality of processing elements, said method being performed by at least one of said processing elements and comprising the steps of:

resolving a set of linear equations into said tasks, which are interrelated by a graph $R_k{}^{ij}$;

distributing each of said tasks to said processing elements;

for each of said tasks, computing a cost metric cost($v_j$) indicative of the amount of time that said processing element receiving said task requires to process said task;

for each of said tasks, computing a remaining completion time metric $\delta_i$ equal to $$\delta_i = \max_k \left( \sum_{p=1}^{i} (\text{cost}(v_p) + v_p \mid v_p \in R_k^{ij} \text{ and } v_p \neq v_i) \right)$$

which is indicative of the amount of time needed by said computer to process all remaining tasks after said task has been completed, and based on said cost metric cost($v_j$); and on each processing element scheduling and processing each of said tasks received by that processing element in an order based on said completion time metric $\delta_i$.

2. The method of claim 1 further comprising the steps of:

for each of said tasks, computing a pipeline latency metric $p_j$ indicative of the amount of time needed by one of said processing elements to partially complete said task; and computing said cost metric cost($v_j$) based on said pipeline latency metric $p_j$.

* * * * *